(12) United States Patent
Xiao et al.

(10) Patent No.: US 11,486,908 B2
(45) Date of Patent: Nov. 1, 2022

(54) ELECTRONIC INTEGRATED MULTI-ELECTRODE DETECTION SYSTEM BASED ON POTENTIAL DETERMINATION

(71) Applicant: SICHUAN UNIVERSITY, Chengdu (CN)

(72) Inventors: Dan Xiao, Chengdu (CN); Chunling Wang, Chengdu (CN); Hongyan Yuan, Chengdu (CN); Zhijuan Duan, Chengdu (CN)

(73) Assignee: SICHUAN UNIVERSITY, Chengdu (CN)

( * ) Notice: Subject to any disclaimer, the term of this patent is extended or adjusted under 35 U.S.C. 154(b) by 526 days.

(21) Appl. No.: 16/486,203

(22) PCT Filed: Feb. 11, 2018

(86) PCT No.: PCT/CN2018/076326
§ 371 (c)(1),
(2) Date: Aug. 15, 2019

(87) PCT Pub. No.: WO2018/149380
PCT Pub. Date: Aug. 23, 2018

(65) Prior Publication Data
US 2020/0057023 A1    Feb. 20, 2020

(30) Foreign Application Priority Data
Feb. 15, 2017    (CN) .......................... 201710079915.X

(51) Int. Cl.
*G01N 27/49*    (2006.01)
*G01R 17/20*    (2006.01)
(Continued)

(52) U.S. Cl.
CPC ........... *G01R 17/20* (2013.01); *G01N 27/416* (2013.01); *G01R 19/10* (2013.01); *G01N 27/333* (2013.01)

(58) Field of Classification Search
CPC .... G01N 27/333; G01N 27/416; G01N 27/49; G01N 27/414; G01N 27/4167;
(Continued)

(56) References Cited

U.S. PATENT DOCUMENTS 4,133,732 A * 1/1979 Boeke ................ G01N 27/4167
                                                       204/414
4,189,367 A * 2/1980 Connery .............. G01N 27/333
                                                       204/401
(Continued)

FOREIGN PATENT DOCUMENTS

| CN | 101846699 A | 9/2010 |
|---|---|---|
| CN | 103140737 A | 6/2013 |
| JP | 2007097020 A | 4/2007 |

*Primary Examiner* — Vinh P Nguyen

(57) ABSTRACT

An electronic integrated multi-electrode detection system of a potential determination includes a multi-electrode array, a circuit unit and a total signal output and acquisition unit. The circuit unit includes a multi-electrode array signal input end, a high input impedance voltage follower, a phase shifting filter circuit, an extension module input end, a summing circuit and a total output signal end. The detection system promotes the detection sensitivity and increase the accuracy and precision of detection results. The detection system can be used for monitoring the change in trace ion concentration in a sample, analyzing a constant conventional sample and analyzing a sample with higher error requirement. The detection system can be widely applied to various analysis detection fields, including life sciences, environmental sciences, medicine clinics, and the like.

6 Claims, 4 Drawing Sheets

(51) Int. Cl.
 G01R 19/10 (2006.01)
 G01N 27/416 (2006.01)
 G01N 27/333 (2006.01)

(58) Field of Classification Search
 CPC .. G01N 27/4148; G01N 29/341; G01N 22/00; G01R 17/20; G01R 19/10; H03F 1/26; H03F 1/42; H03F 2200/36; H03F 2200/372; G05B 19/0423
 See application file for complete search history.

(56) References Cited

U.S. PATENT DOCUMENTS

| | | | | |
|---|---|---|---|---|
| 4,468,608 A | * | 8/1984 | Rolfe | G01N 27/4165 204/401 |
| 4,777,444 A | * | 10/1988 | Beijk | G01N 27/4165 204/401 |
| 7,544,979 B2 | * | 6/2009 | Morgenshtein | G01N 27/4148 257/253 |
| 8,036,841 B2 | * | 10/2011 | Wang | G01N 27/36 702/65 |
| 9,571,121 B2 | * | 2/2017 | Press | H03M 3/476 |
| 2007/0076124 A1 | | 4/2007 | Serizawa et al. | |

* cited by examiner

ELECTRONIC INTEGRATED MULTI-ELECTRODE DETECTION SYSTEM BASED ON POTENTIAL DETERMINATION

CROSS REFERENCE TO RELATED APPLICATION

This application is the national phase entry of International Application No. PCT/CN2018/076326, filed on Feb. 11, 2018, which is based upon and claims priority to Chinese Patent Application No. 201710079915.X, filed on Feb. 15, 2017, the entire contents of which are incorporated herein by reference.

TECHNICAL FIELD

The present invention relates to an analytical detection instrument, relates to the field of analysis and detection, generally including life sciences, environmental sciences, medicine clinics and the like, and particularly relates to a detection which can be used for analysis of samples with trace ion concentration changes, which is a universal electronic integrated multi-electrode detection system of a potential determination.

BACKGROUND

Potentiometric analysis is an important field in analytical chemistry and is an analytical method based on the detection of potential changes of substances in a solution. Potential-based electrode detection, such as ion-selective electrodes, is a widely used detection technique in potentiometric analysis, has the advantages of good selectivity, convenient and quick detection, low price, simple and portable equipment, and can be used for real-time and online analysis, and widely used in scientific research, clinical diagnosis, environmental monitoring and the like. Despite this, ion-selective electrodes still have many challenges and limitations in practical applications. First, because the ion-selective electrode is a type of indicating electrode that is composed of a sensitive film and selectively generates a Nernst response to an ion, and obtains the activity of the ion to be detected according to the Nernst relationship. It is well known that the theoretical slope of the Nernst formula is 59.2/n mV (n refers to the number of electrons participating in an electrode reaction), which is limited by the theoretical value of the Nernst response slope. The sensitivity of the ion-selective electrode is difficult to break through this value in practical work. However, ion analysis of many samples puts forward higher demands on detection sensitivity. Environmental science, especially in life science research and clinical diagnosis, requires a higher sensitivity to ion detection, which in turn puts forward higher demands on the detection sensitivity of ion-selective electrodes, and meanwhile puts forwards high demands on the accuracy and precision of the detection results. For the traditional electrode detection, a relative concentration error caused by accuracy measurement is calculated up to 0.17% according to the theoretical slope value (59.2/n mV). For the detection of relatively high error requirements and the analytic detection of constant conventional samples, this relative error is relatively large and cannot meet the requirements of accurate determination.

Since the first ion-selective electrode, i.e., a lanthanum fluoride single-crystal electrode, was proposed in 1966, the research on sensors related to ion-selective electrodes has been rapidly developed. Selective electrodes for different ion detection have come out one after another, and the sensor researches on ion detection have begun to boom, mainly including the development of new membrane materials, the introduction of new analysis modes, etc., in order to reduce the detection lower limit and improve the electrode selectivity. Of course, some studies to improve detection sensitivity are also included in these researches. However, in the reported researches, the detection sensitivity has not been greatly improved. According to our understanding, it has not been reported that the detection sensitivity is improved and the detection accuracy and precision are high. From the above reports, it is not difficult to see that with the development of human society, environmental changes, etc., the monitoring of ion concentration and its changes has received more and more attention. But in many cases, such as life activities and clinics, the change in ion concentration is very small. To detect such small changes not only requires a high-sensitivity detection method, but also requires accurate and reliable detection results, which is still a challenge for ion sensor detection techniques.

SUMMARY

The technical problem to be solved by the present invention is to provide an electronic integrated multi-electrode detection system of a potential determination. The detection system can greatly improve the Nernst response slope by simultaneous determination of multiple electrodes, and significantly enhance the detection sensitivity. An electronic integrated circuit unit greatly improves the sensitivity while maintaining low background interference, thereby improving the accuracy and precision of detection results. The electronic integrated multi-electrode detection system of the present invention can reduce the relative concentration error caused by accuracy measurement from ±0.2% of the conventional method to ±0.006%, and the error will decrease as the number of electrodes increases. Therefore, the electronic integrated multi-electrode detection system can be used for constant conventional sample analysis and analytic detection with relatively high error requirements in the fields of life sciences, environmental sciences, and the like, and is a universal detection system of a potential determination, accompanied with a broad application prospect.

The technical solution adopted by the present invention to solve the technical problem thereof is: a plurality of electrodes is subjected to phase shifting and filtration, and then summed by an electronic integrated module circuit instead of a simple series connection of a plurality of electrodes. An electronic integrated multi-electrode detection system of a potential determination comprises a multi-electrode array (10), a circuit unit (20), and a total signal output and acquisition unit (30). Output signals from the multi-electrode array pass through a phase shifting filter circuit in the circuit unit, and then pass through a summing circuit to obtain a total output signal.

The phase shifting filter circuit technique is adopted in the circuit unit of the invention to eliminate interference signals mainly based on a power frequency AC signal, reduce the background noise, and improve the detection stability and accuracy.

The detection sensitivity of the system of the present invention increases proportionally with the increase in the number of electrodes, so an expansion module (24) is designed to input signals from other identical or different circuit modules of multi-electrode detection.

The present invention has the following beneficial effects: the Nernst response slope is greatly improved, the detection sensitivity is significantly enhanced, and the accuracy and precision of the detection result are improved. If an electronic integrated multi-electrode detection system composed of m electrodes is used, the slope thereof will be increased to 59.2 m/n mV from 59.2/n mV of a single electrode; the sensitivity will also be increased by m times that of the single electrode; the relative concentration error caused by accuracy measurement is reduced to 1/m times that of the single electrode. The electronic integrated multi-electrode system of the present invention can widely monitor the trace ion concentration change and the analysis of the constant conventional samples in many fields, generally including life sciences, environmental sciences, medicine clinical, etc., and is a universal detection system of a potential determination.

BRIEF DESCRIPTION OF THE DRAWINGS

FIG. 1 shows a circuit diagram of inputs of 10 electrodes. If 10 or less electrodes are used, excess input ends can be grounded; if more than 10 electrodes are used, the electrodes may be accessed through an expansion module (24).

DETAILED DESCRIPTION OF THE EMBODIMENTS

The present invention will be further described below in conjunction with the drawings and embodiments.

Figure 1:
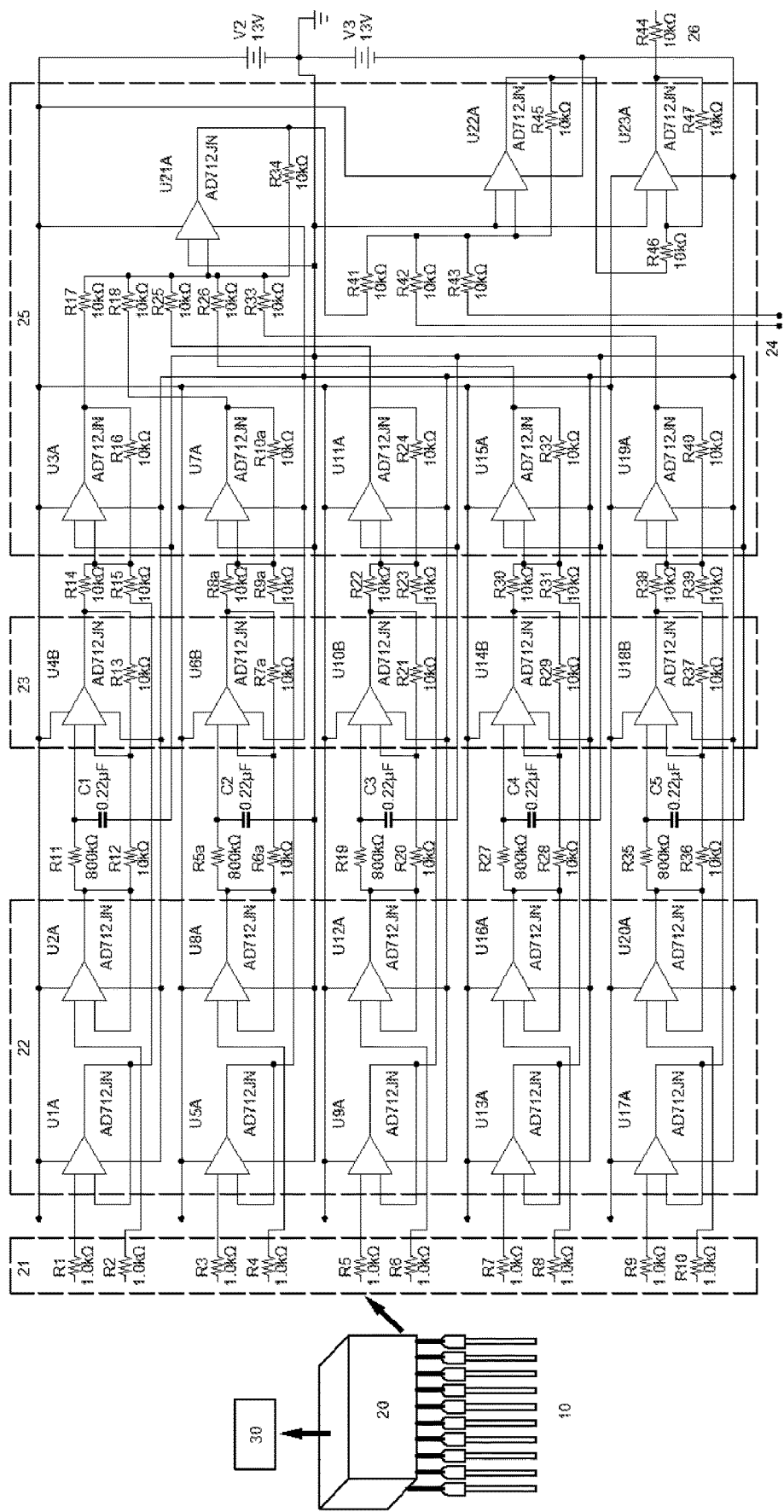
FIG. 1 is a schematic diagram showing a structure and a circuit unit of an electronic integrated multi-electrode detection system of the present invention.

An electronic integrated multi-electrode detection system based on potential determination of the present invention comprises a multi-electrode array (10), a circuit unit (20) and a total signal output and acquisition unit (30). Referring to FIG. 1, the circuit unit mainly comprises a multi-electrode array signal input end (21), a high input impedance voltage follower (22), a phase shifting filter circuit (23), an input end of an extension module (24), a summing circuit (25) and a total output signal end (26). The multi-electrode array signal input end (21) is connected to the input impedance voltage follower (22) in series, the input impedance voltage follower (22) is connected to the phase shifting filter circuit (23) in series, the phase shifting filter circuit (23) is connected to the summing circuit (25) in series, the input end of the extension module (24) is connected to the summing circuit (25) in series, and the total output signal end (26) is connected to the summing circuit (25) in series.

A saturated calomel electrode is used as a reference electrode, a multi-electrode array is adopted as a working electrode, and an output signal of each of a plurality of electrodes is coupled to the electronic integrated multi-electrode detection system. A total output signal is obtained by the circuit unit of the detection system, and coupled to a potential acquirer to acquire signals.

The phase shifting filter circuit (23) is used in the circuit unit to invert a pair of signals from two electrodes, which can eliminate interference signals mainly based on a power frequency AC signal, reduce the background noise, and improve the detection stability.

The summing circuit is used in the circuit unit to sum the signals of the plurality of electrodes, and is combined with the phase shifting filter circuit to significantly enhance the detection sensitivity while maintaining relatively low background noise, so that the change in trace ion concentration in a sample can be accurately monitored.

Figure 2:
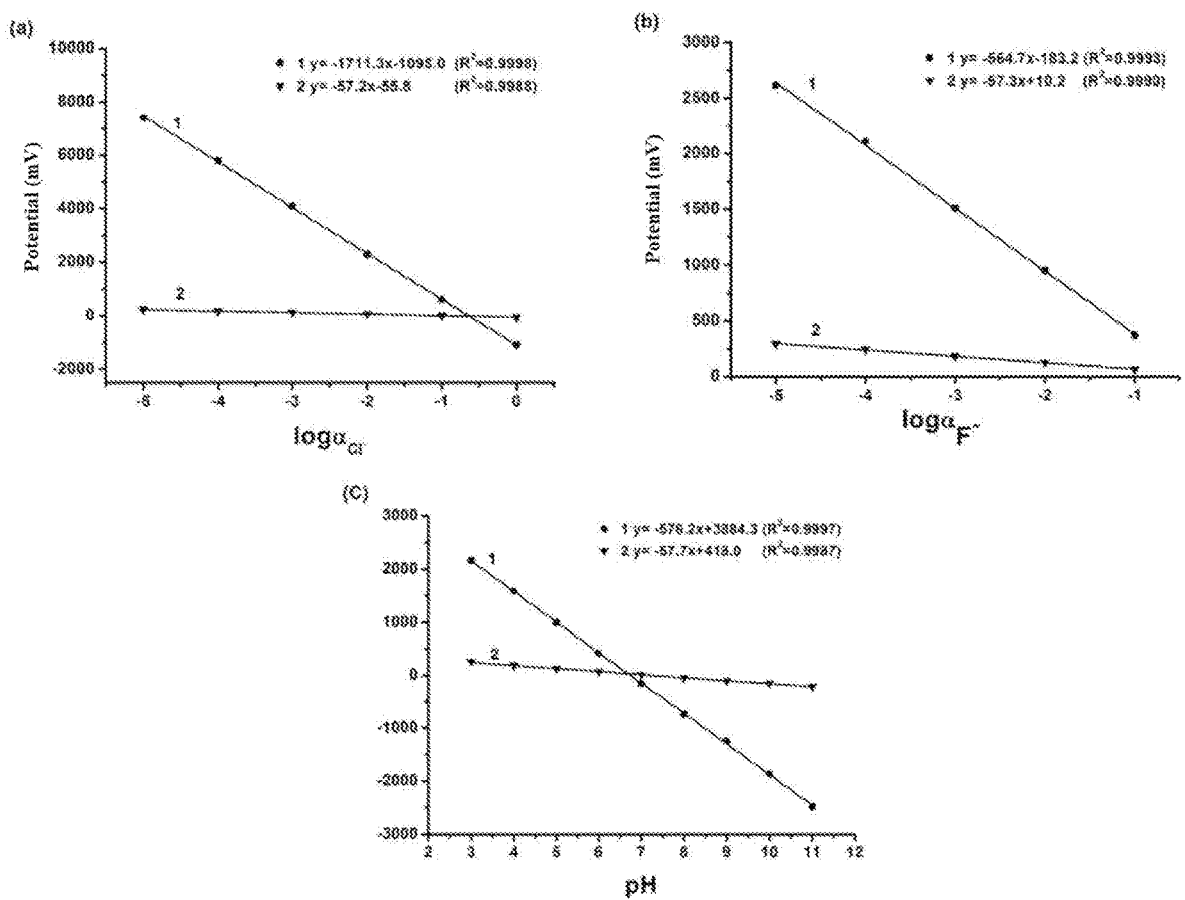
FIG. 2 is a comparison diagram showing a linear relationship between 30 chlorine ion electrodes, 10 fluorine ion electrodes and 10 pH electrodes in an electronic integrated multi-electrode detection system and respective single electrodes.

Embodiment 1: linear relationship experiment. FIG. 2 is a linear relationship diagram under different ion concentrations obtained by using a chloride ion electrode, a fluorine ion electrode, and a pH electrode as working electrodes and a saturated calomel electrode as a reference electrode in the detection system of the present invention. Compared with the linear relationship diagram of a single electrode, we have found that the slope (1711.2 mV) (FIG. 2a, curve 1) of the electronic integrated multi-electrode detection system with 30 chloride ion electrodes is about 30 times of the slope (57.2 mV) (FIG. 2a, curve 2) of the single electrode; and the slope (564.7 mV) (FIG. 2b, curve 1) of the electronic integrated multi-electrode detection system with 10 fluorine ion electrodes and the slope (576.2 mV) (FIG. 2c, curve 1) of the electronic integrated multi-electrode detection system with 10 pH electrodes are about 10 times of the slope (57.3 mV) (FIG. 2b, curve 2) of a single fluorine ion electrode and the slope (57.7 mV) (FIG. 2c, curve 2) of a single pH electrode. The experiment proves that the sensitivity of the electronic integrated multi-electrode detection system based on the potential determination of the present invention is remarkably enhanced, and the enhancement level is proportional to the increase in the number of electrodes. The sensitivity of m electrodes is about m times of the sensitivity of the single electrode.

Embodiment 2: under the detection system of the present invention, titration experiments of different ion electrodes in different solutions are performed.

Figure 3:
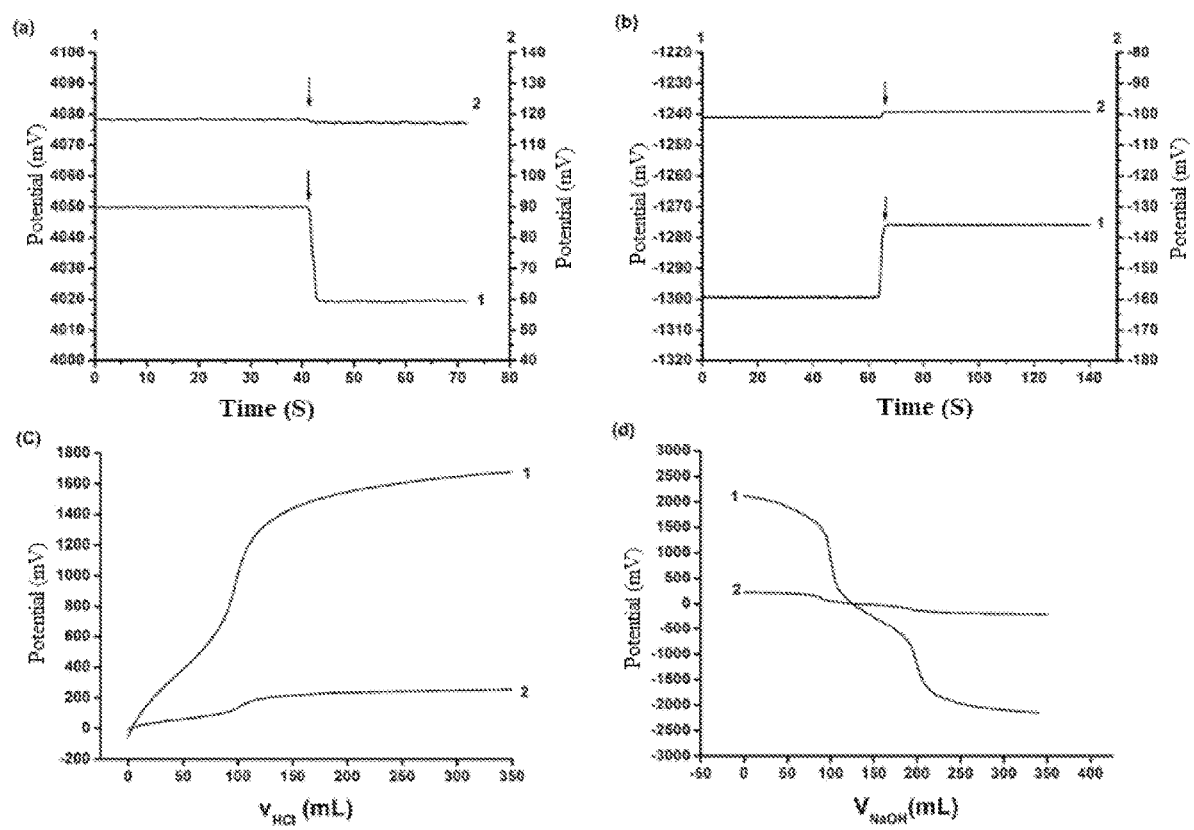
FIG. 3 is a comparison diagram showing titration change curves of 30 chlorine ion electrodes, 10 pH electrodes and the corresponding single electrodes in different solutions.

FIG. 3a is a diagram showing a change curve when a drop of 0.1 mol/L potassium chloride is dropwise added into 100 mL of $1.0 \times 10^{-3}$ mol/L potassium chloride solution in the case where a saturated calomel electrode is used as a reference electrode, and 30 chloride ion electrodes and a single chloride ion electrode are used as working electrodes. The change of the 30 chloride ion electrodes is about 30 mV (theoretical value is 29 mV), and the change of the single chloride ion electrode is 0.8 mV (theoretical value is 0.9 mV).

FIG. 3b is a diagram showing a change curve when a drop of 0.1 mol/L hydrochloric acid is dropwise added in 100 mL of buffer solution (pH9) in the cases where a saturated calomel electrode is used as a reference electrode, and 10 pH electrodes and a single pH electrode are used as working electrodes. The change of 10 pH electrodes is 24 mV (theoretical value is 23 mV), and the change of a single pH electroplate is 2 mV (theoretical value is 2 mV).

FIG. 3c is a diagram showing a change curve when $1.0 \times 10^{-3}$ mol/L hydrochloric acid solution is dropwise added to 100 mL of $1.0 \times 10^{-3}$ mol/L histidine solution in the cases where a saturated calomel electrode is used as a reference electrode, and 10 pH electrodes and a single pH electrode are used as working electrodes.

FIG. 3d is a diagram showing a change curve when $1.0 \times 10^{-3}$ mol/L sodium hydroxide solution is dropwise added to 100 mL of $1.0 \times 10^{-3}$ mol/L phosphoric acid solution in the cases where a saturated calomel electrode is used as a reference electrode, and 10 pH electrodes and a single pH electrode are used as working electrodes.

The experiments have proved that under the multi-electrode electronic integrated multi-plate detection system (FIGS. 3a, b, c, d in curve 1), the titration line change of multiple electrodes is significantly higher than that of a single electrode change (FIGS. 3a, b, c, d in curve 2). It is indicated that the detection system of the present invention can have a significant advantage in the detection of trace changes in ion concentration in the analyte.

Figure 4:
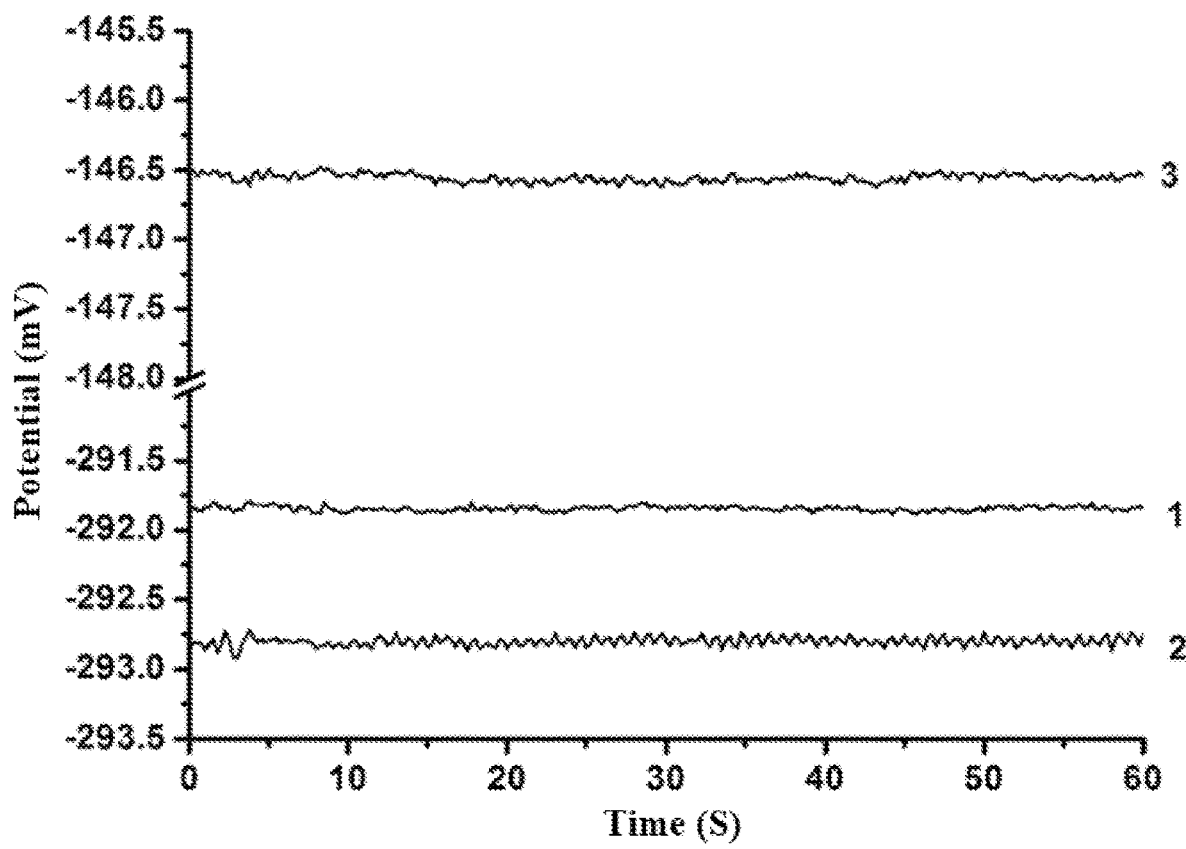
FIG. 4 is a comparison diagram showing baseline noise maps.

Embodiment 3: baseline noise comparison experiment. It can be seen from FIG. 4 that the baseline noise of a single pH electrode (FIG. 4, curve 3) and two pH electrodes without a phase shifting filter circuit (FIG. 4, curve 1) is significantly larger than that of the two pH electrodes passing through the phase shift filter circuit (FIG. 4, curve 2). Experiments have proved that the electronic integrated multi-electrode detection system of the potential determination can effectively reduce the background interference and improve the detection stability. Accurate detection results can be obtained by greatly improving the detection sensitivity while maintaining low background interference.

What is claimed is:

1. An electronic integrated multi-electrode detection system based on a potential determination, comprising: a multi-electrode array, a circuit unit, and a total signal output and acquisition unit, wherein the circuit unit comprises a multi-electrode array signal input end, an input impedance voltage follower, a phase shifting filter circuit, an input end of an extension module, a summing circuit, and a total output signal end; wherein the multi-electrode array signal input end is connected to the input impedance voltage follower in series, the input impedance voltage follower is connected to the phase shifting filter circuit in series, the phase shifting filter circuit is connected to the summing circuit in series, the input end of the extension module is connected to the summing circuit in series, and the total output signal end is connected to the summing circuit in series; wherein the multi-electrode array is coupled to the multi-electrode array signal input end of the circuit unit so that output signals of the multi-electrode array are coupled to the circuit unit, inversely filtered by the phase shifting filter circuit in the circuit unit, and then summed by the summing circuit to obtain a total output signal, and the total output signal is coupled to a potentiometer for a signal acquisition.

2. The electronic integrated multi-electrode detection system according to claim 1, wherein electrodes used in the electronic integrated multi-electrode detection system are electrodes of the potential determination.

3. The electronic integrated multi-electrode detection system according to claim 2, wherein a number of the electrodes is at least two.

4. The electronic integrated multi-electrode detection system according to claim 1, wherein the multi-electrode array includes at least two electrodes.

5. The electronic integrated multi-electrode detection system according to claim 1, wherein the extension module is configured to input signals from other circuit modules identical or different to the extension module.

6. The electronic integrated multi-electrode detection system according to claim 1, wherein the summing circuit is configured to obtain the total output signal.

* * * * *